US005148086A

United States Patent [19]

Costa

[11] Patent Number: 5,148,086

[45] **Date of Patent: * Sep. 15, 1992**

[54] MEANS FOR SECURING INSULATION DISPLACEMENT TERMINALS TO LEADS EXTENDING FROM A FLUORESCENT LIGHT BALLAST

[75] Inventor: Larry J. Costa, Danville, Ill.

[73] Assignee: Valmont Industries, Inc., Valley, Nebr.

[ * ] Notice: The portion of the term of this patent subsequent to Jun. 11, 2008 has been disclaimed.

[21] Appl. No.: 620,360

[22] Filed: Nov. 29, 1990

Related U.S. Application Data

[63] Continuation-in-part of Ser. No. 549,265, Jul. 6, 1990, Pat. No. 5,023,520.

[51] Int. Cl.[5] .............................................. H05K 5/00

[52] U.S. Cl. .................................... 315/276; 174/162; 361/377; 439/848

[58] Field of Search .......................... 315/276, DIG. 5; 336/65, 90; 174/DIG. 2; 361/377, 404; 439/816, 848

[56] References Cited

U.S. PATENT DOCUMENTS 176,069 4/1876 Ryder .................................. 439/848
5,023,520 6/1991 Costa .................................. 315/276

FOREIGN PATENT DOCUMENTS 0355308 6/1922 Fed. Rep. of Germany ...... 439/816
0004088 1/1977 Japan .................................. 439/848

*Primary Examiner*—Robert J. Pascal
*Attorney, Agent, or Firm*—Zarley, McKee, Thomte Voorhees & Sease

[57] ABSTRACT

A ballast connector is described for use with a ballast having windings, resistors, capacitors, etc. mounted therein. An internal connector housing is positioned in one end of the ballast case and has the various leads from the windings, resistors, capacitors, etc. extending outwardly through sockets provided in the internal connector housing. An external connector housing is selectively removably mounted on the ballast case and has its inner end adapted to be received by the outer end of the internal connector housing. A plurality of insulation displacement connectors are positioned in the external connector housing and have one end thereof connected to predetermined leads which extend through the socket in the internal connector housing. The leads are provided with detents on the opposite sides thereof which are received by V-shaped portions of the said one end of the insulation displacement connector. The outer ends of the insulation displacement connectors are electrically connected to service leads.

1 Claim, 5 Drawing Sheets

MEANS FOR SECURING INSULATION DISPLACEMENT TERMINALS TO LEADS EXTENDING FROM A FLUORESCENT LIGHT BALLAST

BACKGROUND OF THE INVENTION

This is a continuation-in-part application of application Ser. No. 07/549,265 filed Jul. 6, 1990 entitled "Ballast Connector", now U.S. Pat. No. 5,023,520.

The invention of the co-pending application related to an improved ballast connector for a ballast utilized in fluorescent lamps or the like. The instant invention relates to an improved means for securing the insulation displacement terminals to the leads extending from the ballast.

Conventional ballasts for fluorescent lamps are usually positioned within a ballast case comprised of a flat base portion and a case or cover portion secured thereto. The conventional ballasts normally include a core and coil subassembly mounted on one end of the base portion with the terminations of the coils extending therefrom. A capacitor/resistor subassembly is normally mounted in the other end of the case portion and usually comprises at least one capacitor and at least one resistor. Such a subassembly is sometimes referred to as a component subassembly. During the manufacture of the ballast, the leads or terminations of the capacitor(s) and resistor(s) are electrically connected to predetermined coil terminations. Elongated, flexible, external leads are also electrically connected, during the manufacturing process, to predetermined coil terminations. The total subassembly is then encased in an asphalt, silica sand potting compound. The base portion is then positioned over the ballast components and secured to the case portion with the flexible leads extending outwardly from the case. The external leads are subsequently electrically connected to leads or terminals in the lamp fixture.

The above-described ballast, although generally satisfactory in operation, suffers some drawbacks or disadvantages. One disadvantage of the prior art ballasts is that different luminaire manufacturers require leads of different lengths thereby requiring the ballast manufacturer to produce, and inventory, ballasts having various lead lengths. Further, each individual manufacturer may require various length leads to accommodate various lamp fixtures.

A further disadvantage of the prior art ballasts is that the external leads, which extend from the ballast, often interfere with other assembly operations. Yet another disadvantage is that the conventional ballast is not easily replaced by the end user should the ballast fail. Still another disadvantage is that the conventional ballast does not lend itself to potential modular product line extension.

A vastly improved ballast of the leadless type is disclosed in the patent application entitled "An Improved Ballast" filed Oct. 14, 1988 under U.S. application Ser. No. 07/257,528 now U.S. Pat. No. 4,916,363. Although the ballast described in U. S. application Ser. No. 257,528 now U.S. Pat. No. 4,916.363 represents a significant advance in the art, it is believed that the instant invention represents an improvement over the invention disclosed in said application.

It is believed that the improved means for connecting the insulation displacement terminals of the ballast of the co-pending application as disclosed herein represents a significant improvement in the art in that a more secure connection is achieved.

SUMMARY OF THE INVENTION

In the ballast connector of the co-pending invention, the ballast, such as described in U.S. application Ser. No. 07/257,528, now U.S. Pat. No. 4,916,363 is provided with an internal connector housing having a portion thereof protruding outwardly through one end of the ballast case. The various leads from the windings, resistor(s), capacitor(s), extend outwardly through sockets provided in the internal connector housing. An external connector housing is selectively removably mounted on the ballast case and has its inner end adapted to be received by the outer end of the internal connector housing. The external connector housing has a plurality of insulation displacement connectors mounted therein which are operatively electrically connected to the leads secured to the internal connector housing. Service leads are electrically connected to the insulation displacement connectors and are maintained in position by a lead retainer which is secured to the end of the ballast case.

In the instant invention, the leads which extend from the ballast components are square and have detent surfaces provided on opposite sides thereof which receive the inner ends of the insulation displacement terminals.

It is therefore a principal object of the invention to provide an improved connector for a leadless ballast.

A further object of the invention is to provide an improved connector terminal for a ballast.

These and other objects will be apparent to those skilled in the art.

DESCRIPTION OF THE PREFERRED EMBODIMENT

Figure 8:
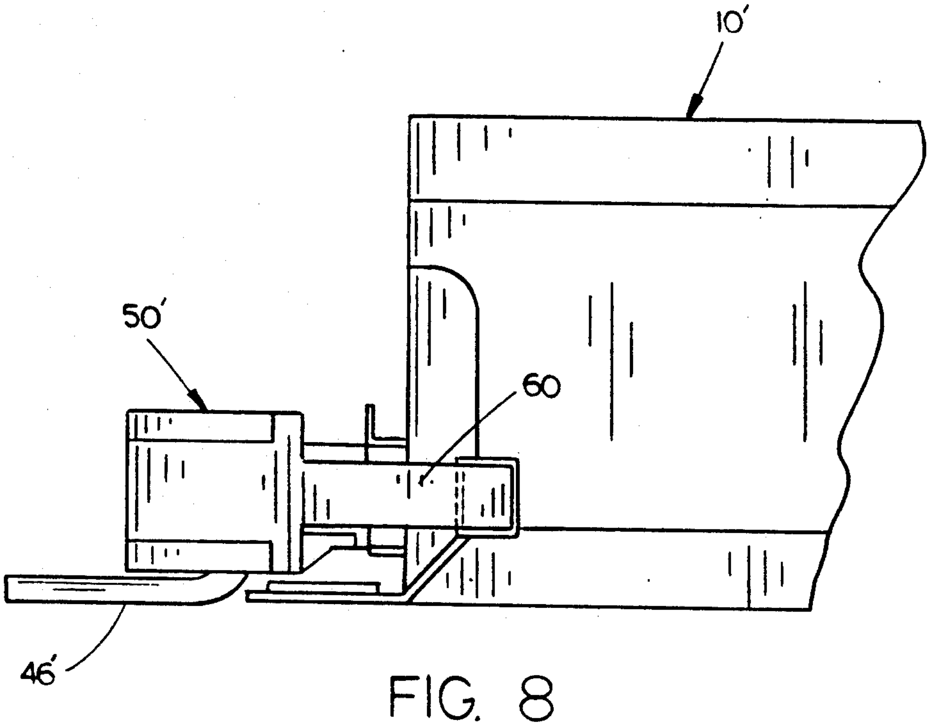
FIG. 8 is a view similar to FIG. 4 except that a modified version of the lead wire retainer is disclosed.
Figure 9:
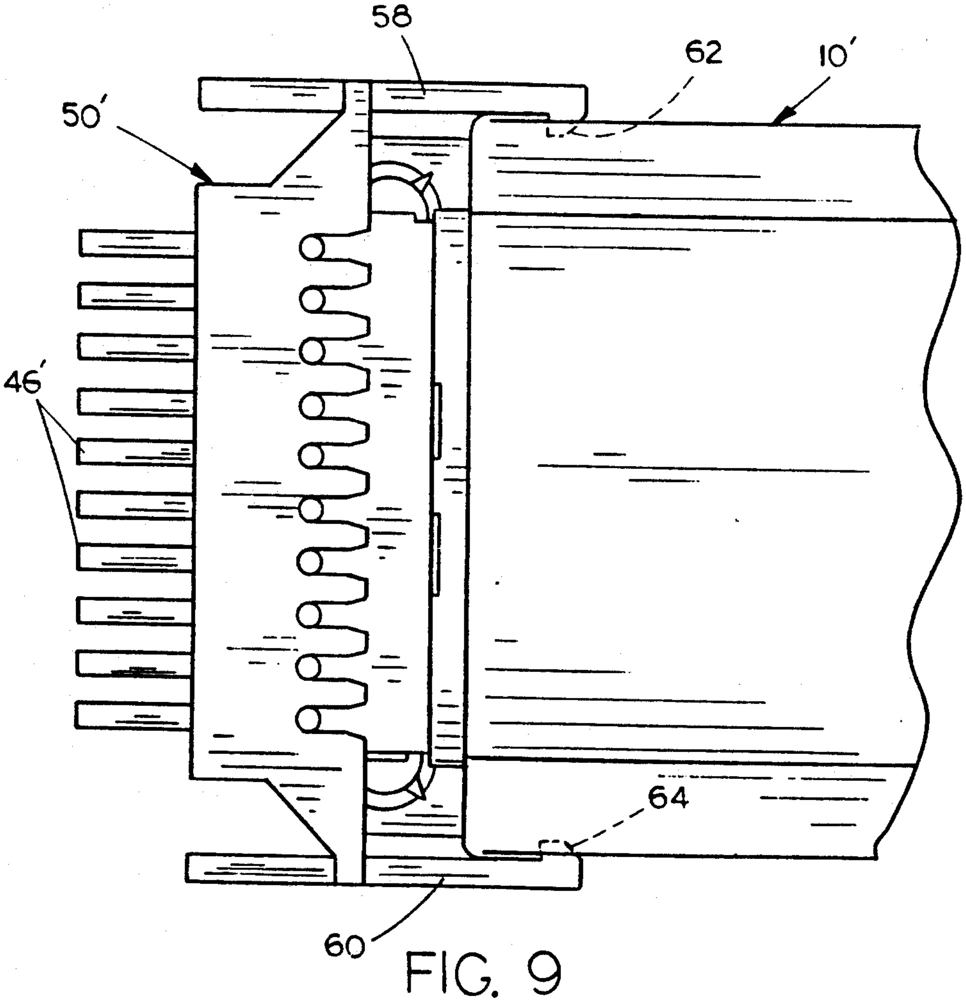
FIG. 9 is a top view of the modified connector of FIG. 8.
Figure 11:
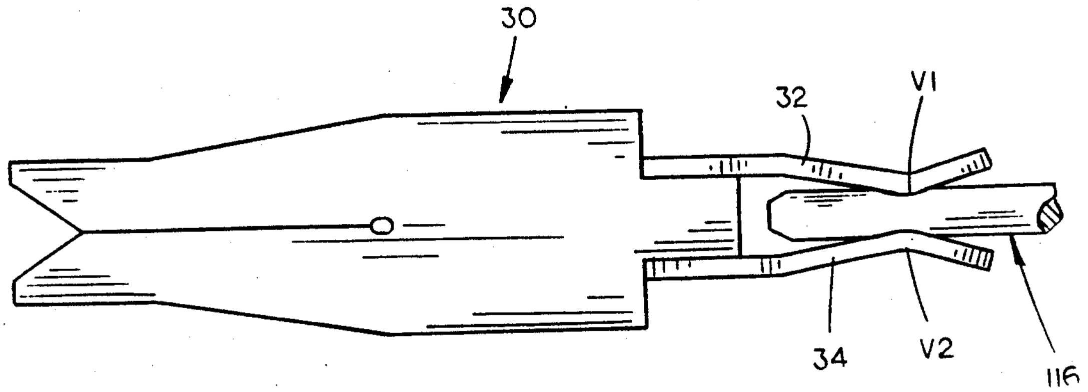
FIG. 11 is a plan view of the lead of FIG. 10 having an insulation displacement connector terminal secured thereto.
Figure 10:
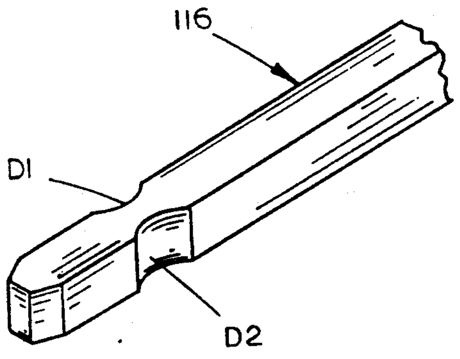
FIG. 10 is a perspective plan view of one of the ballast leads.

FIGS. 1-9 illustrate the ballast connector of the co-pending application while FIGS. 10 and 11 illustrate the improved means for connecting the ballast leads to the insulation displacement connector terminals. In order to more fully understand the importance of the means disclosed in FIGS. 10 and 11, the description of the ballast of the co-pending application, as illustrated in FIGS. 1–9, will be included.

The numeral 10 refers to a ballast comprised of an elongated flat base 12 and case or cover 14. The various components of the ballast are contained within the cover 14 and would normally be enclosed in an asphalt, silica sand potting compound. A plurality of leads 16 are connected to the various components of the ballast and extend outwardly through openings 18 in an internal connector housing 20 positioned at one end of the ballast 10. Lead 16A is 0.050 inch shorter than the remainder of the leads 16. Connector 20 is provided with a header flange 22 which is positioned inwardly of the opening 24 through which the outer end of the connector 20 extends. For purposes of description, connector 20 will be described as having an inner end 26 and an outer end 28. Header flange 22 serves to prevent the potting compound from exiting the opening 24 in which the connector 20 is positioned.

A plurality of insulation displacement connector terminals 30 are provided and include a pair of spring clips 32 and 34 at their inner ends which are adapted to embrace and electrically engage one of the leads 16. The outer end of each of the terminals 30 is provided with a V-shaped opening 36 which communicates with an elongated slot 38 extending inwardly into the terminal which terminates in an optional cut-out 40. When a shielded or insulated lead 46 is inserted into the slot 38, the terminal cuts through the insulation to achieve electrical contact between the electrical wire in the lead 46 and the terminal 30.

The openings or sockets 18 in the internal housing connector 20 are preferably mounted on 0.165 inch centers and are oriented to receive terminals 30 on a carrier strip with 0.330 inch centers. The carriers between the terminals 30 will be removed for individual circuits or left intact for common circuits as required, i.e., dual voltage configuration. The numeral 42 refers to such a carrier strip which is shown in phantom in FIG. 1.

Figure 1:
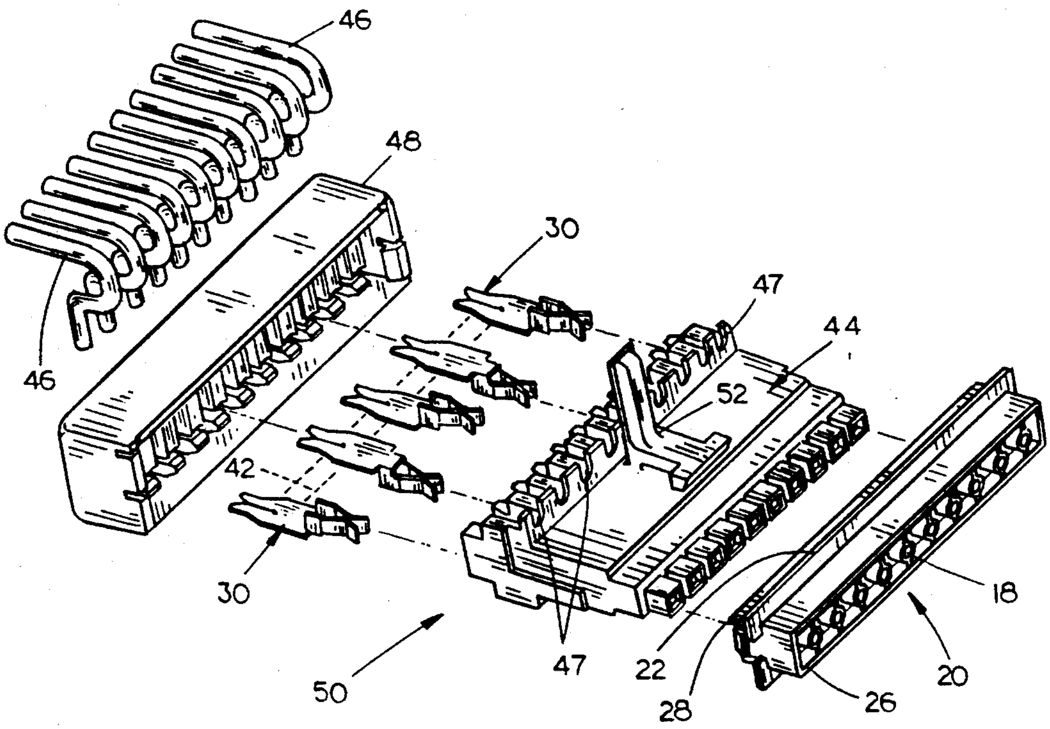
FIG. 1 is an exploded perspective view of the ballast connector of this invention.
Figure 2:
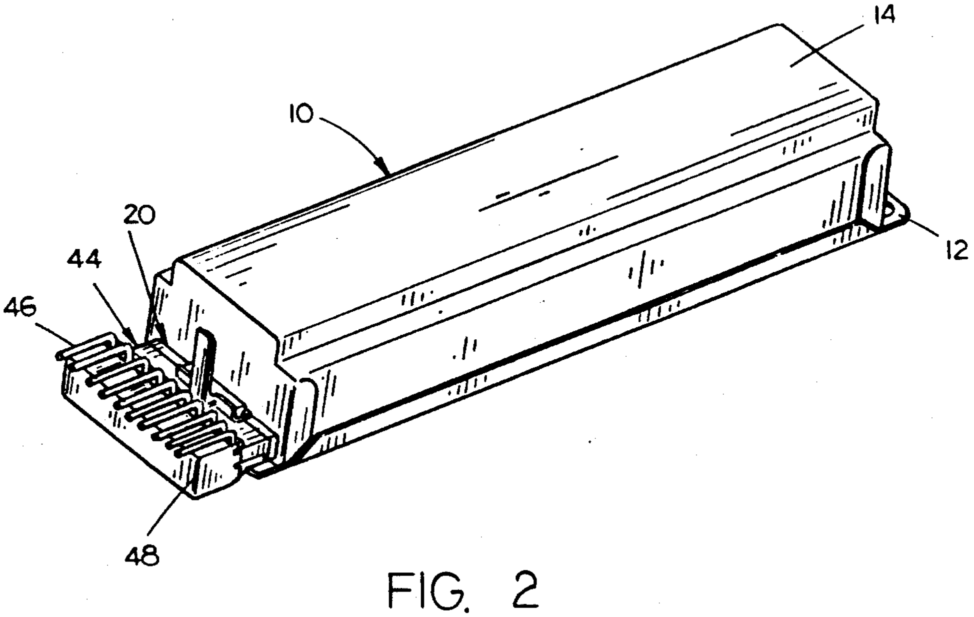
FIG. 2 is a perspective view illustrating the ballast connector of this invention mounted on a ballast.
Figure 3:
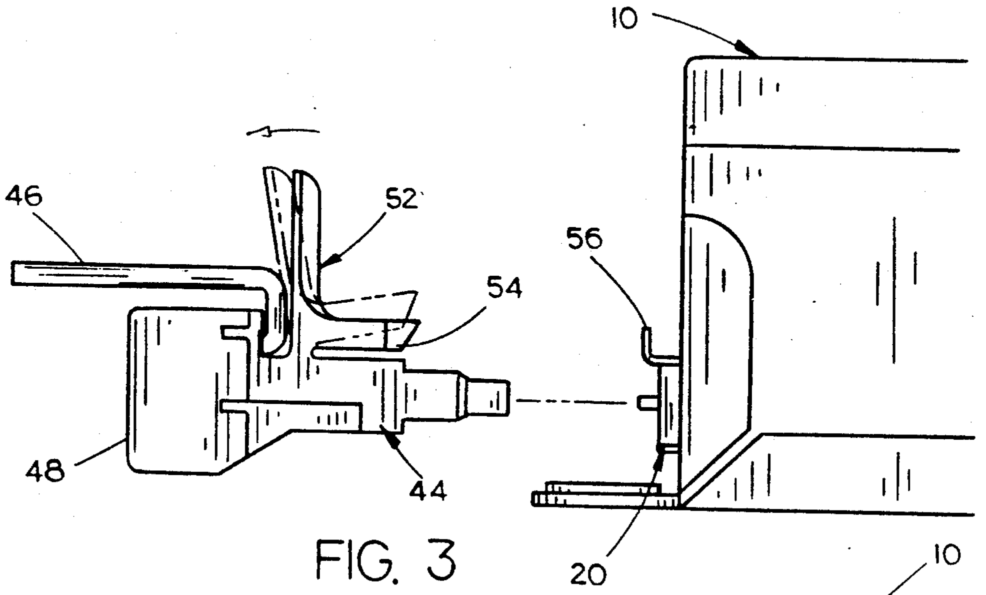
FIG. 3 is a side elevational view illustrating the ballast connector prior to it being connected to the ballast.
Figure 4:
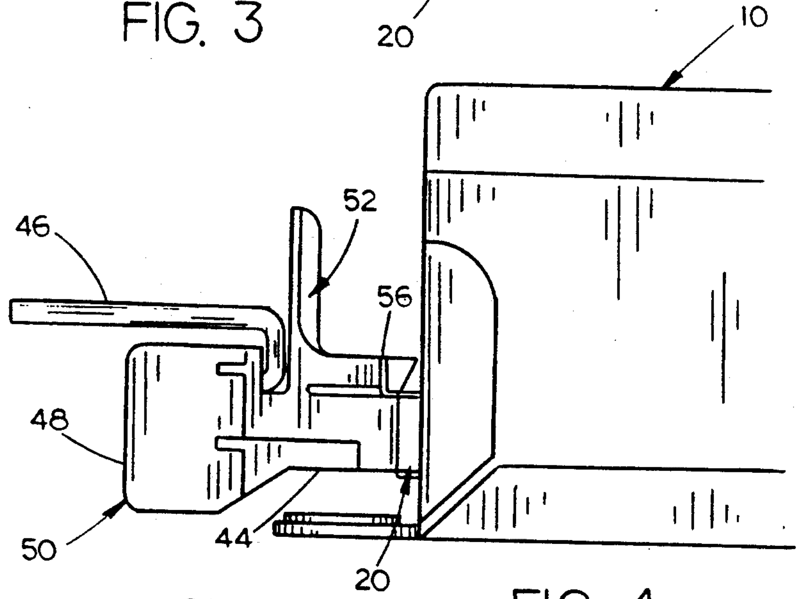
FIG. 4 is a view similar to FIG. 3 except that the ballast connector has been secured to one end of the ballast.
Figure 5:
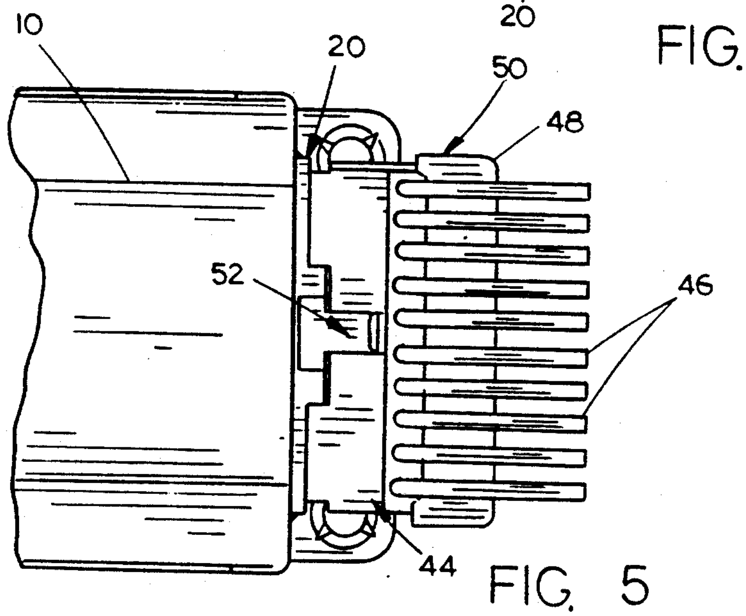
FIG. 5 is a top view of the ballast connector secured to a ballast.
Figure 6:
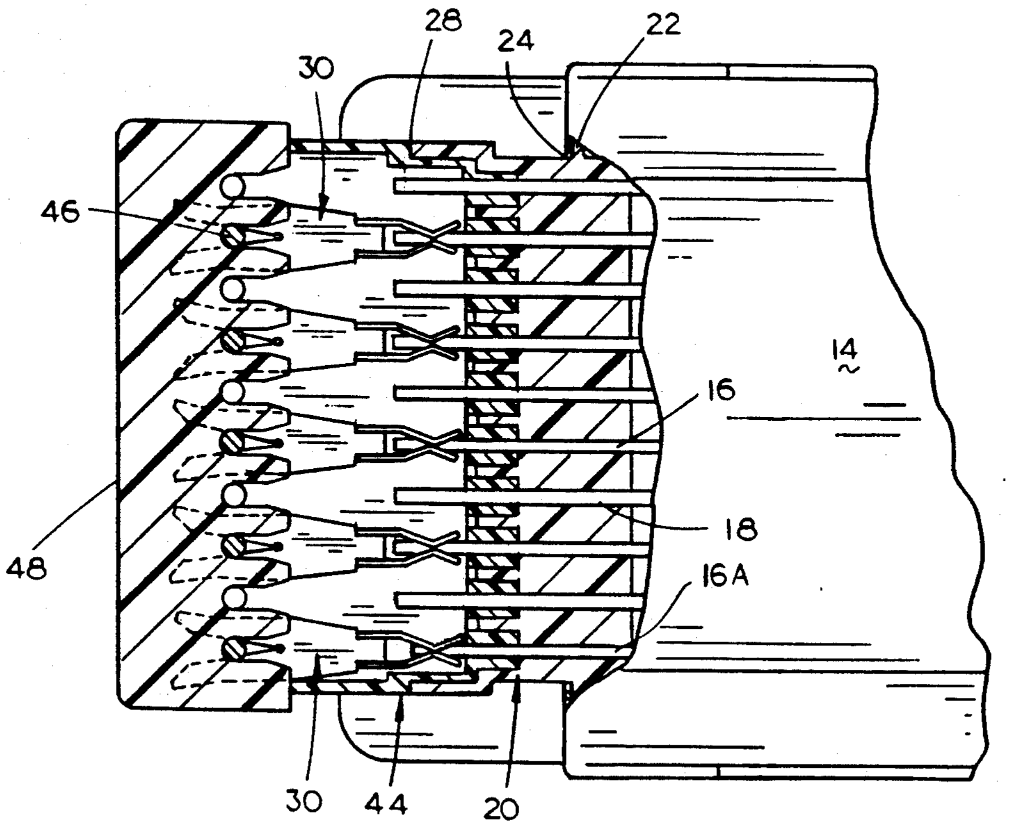
FIG. 6 is a top view of the ballast connector secured to a ballast with portions thereof cut away to more fully illustrate the invention.
Figure 7:
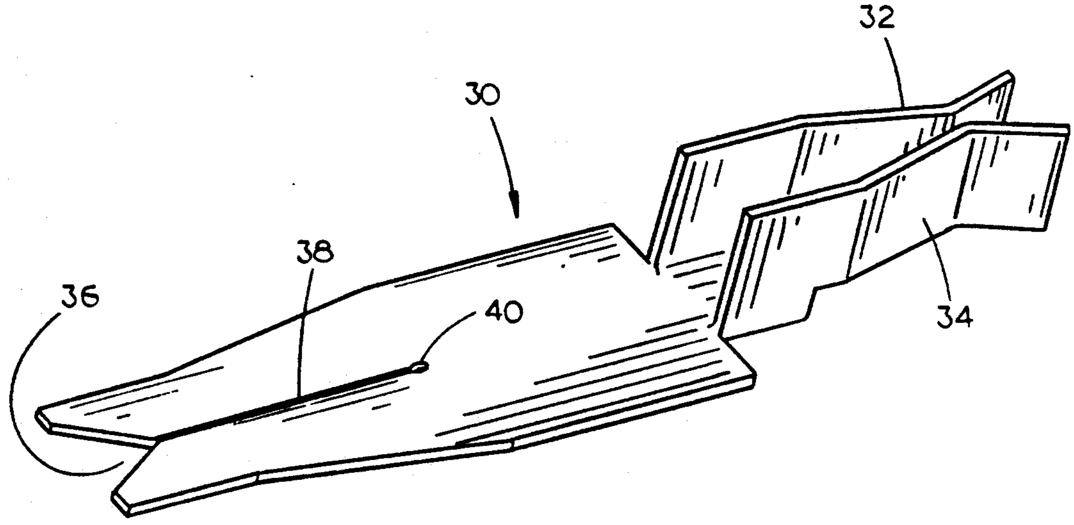
FIG. 7 is a perspective view of one of the insulation displacement connectors.

The inner ends of the terminals 30 are received in suitable openings in the outer end of an external connector housing 44 which is plugged into the outer end of the internal connector housing 20. The individual leads 16 extend outwardly through the internal connector housing 20 into the external connector housing 44. The inner ends of the terminals 30 are snapped onto or engaged with the outer ends of the leads 16 as seen in FIG. 6. Service leads 46 extend horizontally through openings 47 in housing 44 and thence extend downwardly for engagement with the terminals 30. The 90° relationship between lead portions 46*a* and 46*b*, and the insertion of the lead through an opening 47, prevent rotation of the lead in terminal 30. Leads 46 are held in position by a lead retainer 48 which is snapped onto the outer end of the external connector housing 44 to maintain the leads 46 in electrical contact with the terminals 30. Although the drawings illustrate conventional "round" service leads 46, the leads 46 could be comprised of: (1) flexible wiring circuits; (2) ribbon cable; or (3) printed wiring board. The term "service leads" as used herein should not be limited to standard commercial round wires. The components 44, 30, and 48 will be described as comprising the end ballast connector 50. Thus, the ballast 10 may be fabricated and shipped from the factory with the various leads 16 protruding outwardly from the internal housing connector 20. The number of connectors 30 and leads 46 to be used by the end user will depend upon the particular environment in which the ballast will be used. Thus, the supplier or end user may utilize whatever length leads or whatever number leads 46 are desired. The end connector and service leads 46 may be easily connected to the ballast 10 by simply first connecting the leads 46 to the terminals 30 and snapping the lead retainer 48 onto the outer end of the external connector housing 44. External connector housing 44 is then plugged into the outer end of the internal housing connector 20 with the latching assembly 52 being deflected so that the latch 54 may pass over the flange or retainer 56 on the outer end of the ballast 10. When it is desired to remove the end connector 50 from the ballast 10, the latch 52 is simply deflected to the position illustrated by broken lines in FIG. 3 so that the latch 54 may be moved out of engagement with the element 56.

Latching assembly 52 and its associated components, namely latch 54 and retainer 56, are optional in that other ways of attaching the end ballast connector 50 to the ballast 10 may be utilized or the latching assembly 50 omitted. The interface or frictional engagement between the various components will serve to connect the assembly.

A modified version of the connector 50′ is illustrated in FIGS. 8 and 9. The latch assembly 52 has been omitted from the connector 50′ in FIGS. 8 and 9 with the connector 50′ being simply secured to the ballast 10′ by means of the latching arms 58 and 60 having the inner ends thereof adapted to be received in recesses 62 and 64 respectively. It can also be seen that the service leads 46′ exit from the lower end of the connector 50′ Latching arms 58 and 60 of connector 50′ are optional. If latching arms 58 and 60 are omitted, the connector 50′ will be held in position on ballast 10′ by the interface between the various components.

Lead 16A is the line voltage lead to energize the ballast. Lead 16A is approximately 0.050 inch shorter than the other leads 16 to ensure that the line voltage is disengaged before the neutral and ballast output load is uncoupled. This feature reduces the possibility that a person changing a ballast will be shocked with the high voltage potential of an energized ballast.

FIG. 10 illustrates the configuration of the lead of the invention of this application. With respect to FIG. 10, the reference numeral 116 refers to one of the leads which extends from the components of the ballast. It should be understood that a plurality of the leads 116 will be employed rather than the single lead 16 of the embodiment illustrated in FIGS. 1–9. Lead 116 has a square cross-section and is provided with detents D1 and D2 formed on opposite sides thereof as illustrated in FIG. 10. Detents D1 and D2 are adapted to receive V-shaped portions V1 and V2 of the spring clips 32 and 34 of the insulation displacement connector terminal 30. The spring action of the spring clips 32 and 34 causes the V-shaped portions V1 and V2 to be received in the detents D1 and D and to remain therein so that the terminal 30 is positively connected to the lead 116 to ensure a proper connection therebetween and to ensure that the terminal 30 will not inadvertently disconnect from the lead 116.

Thus it can be seen that a novel means has been provided for connecting the terminals of the ballast to the ballast leads.

I claim:

1. In combination, a ballast for a fluorescent light including a case portion having the ballast components positioned therein and a base secured to said case portion, at least some of said ballast components having an elongated conductor extending therefrom, said case portion including opposite ends, one end of said case portion having an opening formed therein, an internal connector housing means positioned in said opening and having an inner end positioned in said case portion and an outer end positioned outwardly of said case portion, said internal connector means having a plurality of elongated openings formed therein which receive the elongated conductors extending therethrough, an external connector housing means having inner and outer ends and having its inner end positioned adjacent the outer end of said internal connector housing means, a plurality of connector terminals in said external connector housing means having inner and outer means, the inner ends of said connector terminals being selectively removably secured to predetermined conductors, the outer ends of said connector terminals adapted to have service leads selectively removably secured thereto, and a lead wire retainer means at the outer end of said external connector housing means for retaining the service leads in said connector terminals, each of said connector terminals comprising a flat outer end portion and a pair of upstanding spring clips positioned inwardly thereof, each of said spring clips having opposing V-shaped portions thereon adapted to engage predetermined conductors, each of said predetermined conductors having a detent means formed therein which receives the V-shaped portions of said spring clips.

* * * * *